United States Patent
Chin et al.

(10) Patent No.: US 7,975,209 B2
(45) Date of Patent: *Jul. 5, 2011

(54) NON-VOLATILE MEMORY WITH GUIDED SIMULATED ANNEALING ERROR CORRECTION CONTROL

(75) Inventors: Henry Chin, Palo Alto, CA (US); Nima Mokhlesi, Los Gatos, CA (US)

(73) Assignee: SanDisk Technologies Inc., Plano, TX (US)

( * ) Notice: Subject to any disclaimer, the term of this patent is extended or adjusted under 35 U.S.C. 154(b) by 1009 days.

This patent is subject to a terminal disclaimer.

(21) Appl. No.: 11/694,950

(22) Filed: Mar. 31, 2007

(65) Prior Publication Data

US 2008/0244367 A1    Oct. 2, 2008

(51) Int. Cl.
*H03M 13/00* (2006.01)

(52) U.S. Cl. ........ 714/780; 714/795; 714/794; 375/262; 375/341

(58) Field of Classification Search .......... 714/780, 714/794, 795; 375/341, 262
See application file for complete search history.

(56) References Cited

U.S. PATENT DOCUMENTS

| | | | |
|---|---|---|---|
| 4,397,022 A | 8/1983 | Weng et al. | |
| 5,091,945 A * | 2/1992 | Kleijn | 704/219 |
| 5,657,354 A | 8/1997 | Thesling, III et al. | |
| 5,822,225 A | 10/1998 | Quaderer et al. | |
| 6,023,783 A * | 2/2000 | Divsalar et al. | 714/792 |
| 6,041,001 A | 3/2000 | Estakhri | |
| 6,134,140 A | 10/2000 | Tanaka et al. | |
| 6,208,560 B1 | 3/2001 | Tanaka et al. | |
| 6,209,113 B1 | 3/2001 | Roohparvar | |
| 6,226,200 B1 | 5/2001 | Eguchi et al. | |
| 6,434,055 B2 | 8/2002 | Tanaka et al. | |
| 6,516,455 B1 * | 2/2003 | Teig et al. | 716/123 |
| 6,574,146 B2 | 6/2003 | Micheloni et al. | |
| 6,581,182 B1 * | 6/2003 | Lee | 714/795 |
| 6,621,739 B2 | 9/2003 | Gonzalez et al. | |
| 6,671,852 B1 | 12/2003 | Ariel et al. | |

(Continued)

FOREIGN PATENT DOCUMENTS

WO    2004112040    12/2004

OTHER PUBLICATIONS

U.S. Appl. No. 11/694,951, filed Mar. 31, 2007.

(Continued)

*Primary Examiner* — Guy J Lamarre
(74) *Attorney, Agent, or Firm* — Vierra Magen Marcus & DeNiro LLP

(57) ABSTRACT

Data in non-volatile storage is decoded using iterative probabilistic decoding. An error correcting code such as a low density parity check code may be used. In one approach, initial reliability metrics, such as logarithmic likelihood ratios, are used in decoding sensed states of a set of non-volatile storage elements. The decoding attempts to converge by adjusting the reliability metrics for bits in code words which represent the sensed state. Simulated annealing using an adjustable temperature parameter based on a level of error in the data can be performed to. The simulated annealing can introduce randomness, as noise for example, into the decoding process. Moreover, knowledge of the device characteristics can be used to guide the simulated annealing process rather than introducing absolute randomness. The introduction of a degree of randomness adds flexibility that permits possible faster convergence times and convergence in situations where data may otherwise be uncorrectable.

19 Claims, 12 Drawing Sheets

U.S. PATENT DOCUMENTS

| | | |
|---|---|---|
| 6,683,817 B2 | 1/2004 | Wei et al. |
| 6,850,441 B2 | 2/2005 | Mokhlesi et al. |
| 6,988,175 B2 | 1/2006 | Lasser |
| 6,999,366 B2 | 2/2006 | Perner et al. |
| 7,000,168 B2 | 2/2006 | Kurtas et al. |
| 7,031,090 B2 | 4/2006 | Ichihara et al. |
| 7,237,181 B2 | 6/2007 | Richardson |
| 7,533,328 B2 | 5/2009 | Alrod et al. |
| 7,555,070 B1 | 6/2009 | Ulriksson et al. |
| 7,558,109 B2 | 7/2009 | Brandman et al. |
| 7,599,224 B2 | 10/2009 | Lee |
| 7,606,070 B2 | 10/2009 | Mokhlesi |
| 7,710,674 B2 | 5/2010 | Esumi et al. |
| 2003/0217323 A1 | 11/2003 | Guterman et al. |
| 2005/0160350 A1 | 7/2005 | Dror et al. |
| 2006/0028875 A1 | 2/2006 | Avraham et al. |
| 2006/0101193 A1 | 5/2006 | Murin |
| 2006/0140010 A1 | 6/2006 | Bedarida et al. |
| 2007/0070696 A1 | 3/2007 | Avraham |
| 2007/0086239 A1 | 4/2007 | Litsyn et al. |
| 2007/0089034 A1 | 4/2007 | Litsyn et al. |
| 2007/0091677 A1 | 4/2007 | Lasser |
| 2007/0104300 A1 | 5/2007 | Esumi et al. |
| 2007/0104301 A1 | 5/2007 | Esumi et al. |
| 2007/0110188 A1 | 5/2007 | Esumi et al. |
| 2007/0124649 A1 | 5/2007 | Esumi et al. |
| 2007/0168837 A1 | 7/2007 | Murin |
| 2007/0171714 A1 | 7/2007 | Wu et al. |
| 2007/0171730 A1 | 7/2007 | Ramamoorthy et al. |
| 2007/0237006 A1 | 10/2007 | Murin et al. |
| 2007/0283214 A1 | 12/2007 | Lasser |
| 2008/0010581 A1 | 1/2008 | Alrod et al. |
| 2008/0082897 A1 | 4/2008 | Brandman et al. |
| 2008/0092014 A1 | 4/2008 | Brandman et al. |
| 2008/0092015 A1 | 4/2008 | Brandman et al. |
| 2008/0092026 A1 | 4/2008 | Brandman et al. |
| 2008/0109702 A1 | 5/2008 | Brandman |
| 2008/0109703 A1 | 5/2008 | Brandman |
| 2008/0123420 A1 | 5/2008 | Brandman et al. |
| 2008/0151617 A1 | 6/2008 | Alrod et al. |
| 2008/0244338 A1 | 10/2008 | Mokhlesi et al. |
| 2008/0244360 A1 | 10/2008 | Mokhlesi et al. |
| 2008/0244368 A1* | 10/2008 | Chin et al. .............. 714/800 |
| 2008/0301523 A1 | 12/2008 | Eudes |

OTHER PUBLICATIONS

S. Kirkpatrick, C.D. Gelatt Jr., M.P. Vecchi, M.P., "Optimization by Simulated Annealing," Science, vol. 220, No. 4598, May 13, 1983.

Neal, Radford M., "Monte Carlo Decoding of LDPC Codes," Dept. of Statistics and Dept. of Computer Science, University of Toronto, May 2001.

U.S. Appl. No. 11/536,286, filed Sep. 28, 2006.

U.S. Appl. No. 11/556,632, filed Nov. 3, 2006.

D. MacKay, "Information Theory, Inference and Learning Algorithms," Cambridge University Press 2003, Chapter 47.

F. Sun, K. Rose, and T. Zhang, "On the Use of Strong BCH Codes for Improving Multilevel NAND Flash Memory Storage Capacity," IEEE Workshop on Signal Processing (SiPS): Design and Implementation, Oct. 2006.

N. Shibata, et al., A 70nm 16 Gb 16-level-cell NAND Flash Memory, 2007 Symp. on VLSI Circuits Digest of Technical Papers, pp. 190-191, Jun. 14-16, 2007.

Y. Zhang, et al., "An Integrated Phase Change Memory Cell With Ge Nanowire Diode For Cross-Point Memory," 2007 Symp. on VLSI Circuits Digest of Technical Papers, pp. 98-99, Jun. 14-16, 2007.

D.H. Kang, et al., "Novel Heat Dissipating Cell Scheme For Improving A Reset Distribution In A 512M Phase-Change Random Access Memory (PRAM)," 2007 Symp. on VLSI Circuits Digest of Technical Papers, pp. 96-97, Jun. 14-16, 2007.

H. Tanaka, et al., "Bit Cost Scalable Technology With Punch And Plug Process For Ultra High Density Flash Memory," 2007 Symps. on VLSI Circuits Digest of Technical Papers, pp. 14-15, Jun. 14-16, 2007.

Final Office Action dated Dec. 7, 2010, United States Patent & Trademark Office, U.S. Appl. No. 11/694,951, filed Mar. 31, 2007.

International Search Report & The Written Opinion of the International Searching Authority dated Jul. 21, 2008, Patent Cooperation Treaty, PCT Application No. PCT/US2008/057722 filed Mar. 20, 2008.

Office Action dated Aug. 19, 2010, U.S. Appl. No. 11/694,947, filed Mar. 31, 2007.

Response A to Office Action dated Sep. 17, 2010, U.S. Appl. No. 11/694,947, filed Mar. 31, 2007.

Office Action dated Oct. 12, 2010, U.S. Appl. No. 11/694,947, filed Mar. 31, 2007.

Preliminary Amendment dated Aug. 11, 2008, U.S. Appl. No. 11/694,948, filed Mar. 31, 2007.

Office Action dated Aug. 19, 2010, U.S. Appl. No. 11/694,948, filed Mar. 31, 2007.

Response A to Office Action dated Sep. 17, 2010, U.S. Appl. No. 11/694,948, filed Mar. 31, 2007.

Office Action dated Oct. 12, 2010, U.S. Appl. No. 11/694,948, filed Mar. 31, 2007.

Office Action dated Aug. 19, 2010, U.S. Appl. No. 11/694,951, filed Mar. 31, 2007.

"Soft Decoding of Hard and Soft Bits Read From A Flash Memory," IP.com Journal, IP.com Inc., West Henrietta, NY, U.S., Mar. 4, 2007.

Response A to Office Action dated Nov. 30, 2010, U.S. Appl. No. 11/694,951, filed Mar. 31, 2007.

Response to Office Action dated Feb. 14, 2011, U.S. Appl. No. 11/694,947 filed Mar. 31, 2007.

Response to Office Action dated Feb. 14, 2011, U.S. Appl. No. 11/694,948 filed Mar. 31, 2007.

Notice of Allowance and Fee(s) Due dated Feb. 28, 2011, United States Patent & Trademark Office, U.S. Appl. No. 11/694,947 filed Mar. 31, 2007.

Notice of Allowance and Fee(s) Due dated Mar. 3, 2011, United States Patent & Trademark Office, U.S. Appl. No. 11/694,948 filed Mar. 31, 2007.

Response to Final Office Action dated Mar. 7, 2011, U.S. Appl. No. 11/694,951 filed Mar. 31, 2007.

Notice of Allowance and Fee(s) Due dated Mar. 10, 2011, United States Patent & Trademark Office, U.S. Appl. No. 11/694,951 filed Mar. 31, 2007.

* cited by examiner

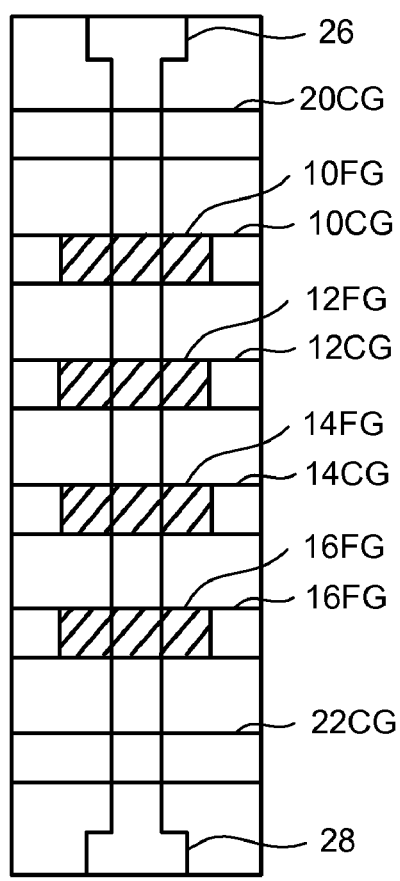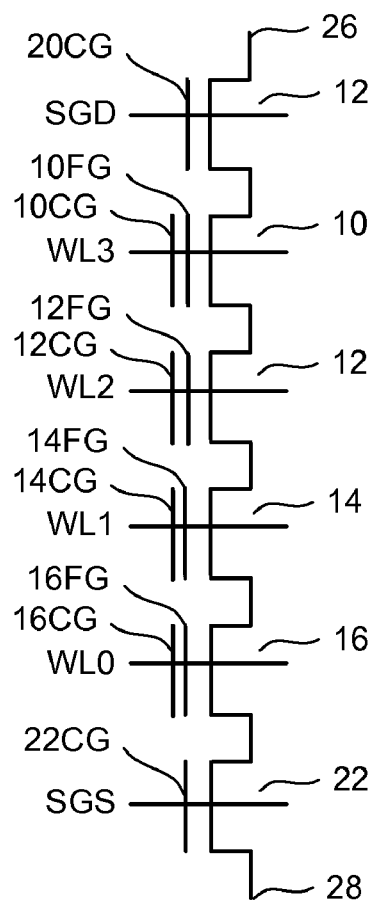

Spare parity check matrix H, 520

Variable nodes

| | v1 | v2 | v3 | v4 | v5 | v6 | v7 | v8 | v9 | v10 | v11 | v12 | v13 |
|---|---|---|---|---|---|---|---|---|---|---|---|---|---|
| cn1 | | 1 | | 1 | | | | | | | 1 | | 1 |
| cn2 | 1 | | | | | 1 | | | | | 1 | | |
| cn3 | | | 1 | | 1 | 1 | | | 1 | 1 | | | |
| cn4 | | 1 | | | | | 1 | | | 1 | | | |
| cn5 | | | | 1 | | 1 | | | | | | 1 | |
| cn6 | 1 | | | 1 | 1 | | 1 | | | | | | |
| cn7 | | 1 | | | | | | 1 | | 1 | | | 1 |
| cn8 | | | 1 | | | 1 | | | | | 1 | 1 | |
| cn9 | 1 | 1 | 1 | | | | | | | | | | 1 |
| cn10 | | | | | | | 1 | 1 | 1 | 1 | | | |

Check nodes

Spare bipartite graph, 530

Qv(initial) initial LLR estimates based on reading

Qv(final) final LLR estimates at the end of decoding

NON-VOLATILE MEMORY WITH GUIDED SIMULATED ANNEALING ERROR CORRECTION CONTROL

CROSS-REFERENCE TO RELATED APPLICATIONS

This application is related to co-pending, commonly assigned U.S. patent application Ser. No. 11/694,951, filed herewith, entitled "Guided Simulated Annealing in Non-Volatile Memory Error Correction Control," cross-referenced and incorporated by reference herein in its entirety.

BACKGROUND OF THE INVENTION

1. Field of the Invention

Embodiments of the present disclosure are directed to non-volatile memory technology.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate. Another type of memory cell useful in flash EEPROM systems utilizes a non-conductive dielectric material in place of a conductive floating gate to store charge in a non-volatile manner.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage VPGM applied to the control gate during a program operation is applied as a series of pulses that increase in magnitude over time. In one possible approach, the magnitude of the pulses is increased with each successive pulse by a predetermined step size, e.g., 0.2-0.4 V. VPGM can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically VPGM is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent App. Pub. 2005/0024939, titled "Detecting Over Programmed Memory," published Feb. 3, 2005; both of which are incorporated herein by reference in their entirety.

Once a non-volatile storage element has been programmed, it is important that its programming state can be read back with a high degree of reliability. However, the sensed programming state can sometimes vary from the intended programming state due to factors including noise and the tendency of devices to gravitate towards charge neutrality over time.

Consequently, it is common for to encounter erroneous or corrupted data bits at the time of reading non-volatile memory. Typically, some form of error correction control (ECC) is applied to correct erroneous or corrupted data. One common control stores additional parity bits to set the parity of a group of data bits to a required logical value when the data is written. The informational and parity bits form an encoded word stored during the write process. The ECC decodes the bits by computing the parity of the group of bits when reading the data to detect any corrupted or erroneous data.

SUMMARY OF THE INVENTION

Data stored in non-volatile storage is decoded using iterative probabilistic decoding. An error correcting code such as a low density parity check code may be used. In one approach, initial reliability metrics, such as logarithmic likelihood ratios, are used in decoding sensed states of a set of non-volatile storage elements. The decoding attempts to converge by adjusting the reliability metrics for bits in code words which represent the sensed state. Simulated annealing using an adjustable temperature parameter based on a level of error in the data read from the system can be performed to assist the iterative decoding process. The simulated annealing can introduce randomness, as noise for example, into the metric based decoding process. Moreover, knowledge of the device characteristics can be used to guide the simulated annealing process rather than introducing absolute randomness. The introduction of a degree of randomness adds flexibility during the iterative decoding that permits possible faster convergence times and convergence in situations where data may otherwise be uncorrectable. In another embodiment, the introduction of a guided component can also obviate the need for any randomness in the process.

A method of reading non-volatile memory is provided in one embodiment that includes reading a set of user data from a set of non-volatile storage elements, detecting one or more errors associated with the set of user data, iteratively decoding the user data using reliability metrics for portions of the set of user data, where the decoding includes simulating annealing for one or more portions of user data to cause a change in one or more of the corresponding reliability metrics.

A method of reading non-volatile memory is provided in one embodiment that includes detecting state information for a set of non-volatile storage elements, providing one or more code words based on the state information, detecting one or more errors associated with the one or more code words and performing a number of iterations of decoding for the one or more code words, wherein the decoding includes assigning reliability metrics to bits of the one or more code words and adjusting the reliability metrics for subsequent decoding iterations in an attempt to decrease said one or more errors. After the number of iterations, the method simulates annealing for the one or more code words, wherein simulating annealing includes providing at least a pseudo-random adjustment to one or more of the reliability metrics.

One exemplary implementation includes a set of non-volatile storage elements and one or more managing circuits in communication with the set of non-volatile storage elements. The one or more managing circuits can perform the processes described above. In one embodiment for guided decoding, a non-volatile memory system can include a set of non-volatile storage elements and managing circuitry in communication with the set of non-volatile storage elements. The managing circuitry reads information from the set of storage elements by reading a set of user data from the set of non-volatile storage elements, detecting one or more errors associated with the set of user data, and iteratively decoding the user data using reliability metrics for portions of the set of user data. The decoding can include simulating annealing for one or more portions of user data to cause a change in one or more of the corresponding reliability metrics. In one embodiment, the managing circuitry is a controller. Various state machine, decoder, and sense amplifier circuitry can further be provided as part of the managing circuitry.

BRIEF DESCRIPTION OF THE DRAWINGS

FIG. 1 is a top view of an exemplary NAND string.

FIG. 2 is an equivalent circuit diagram of the NAND string of FIG. 1.

DETAILED DESCRIPTION

Figure 3:
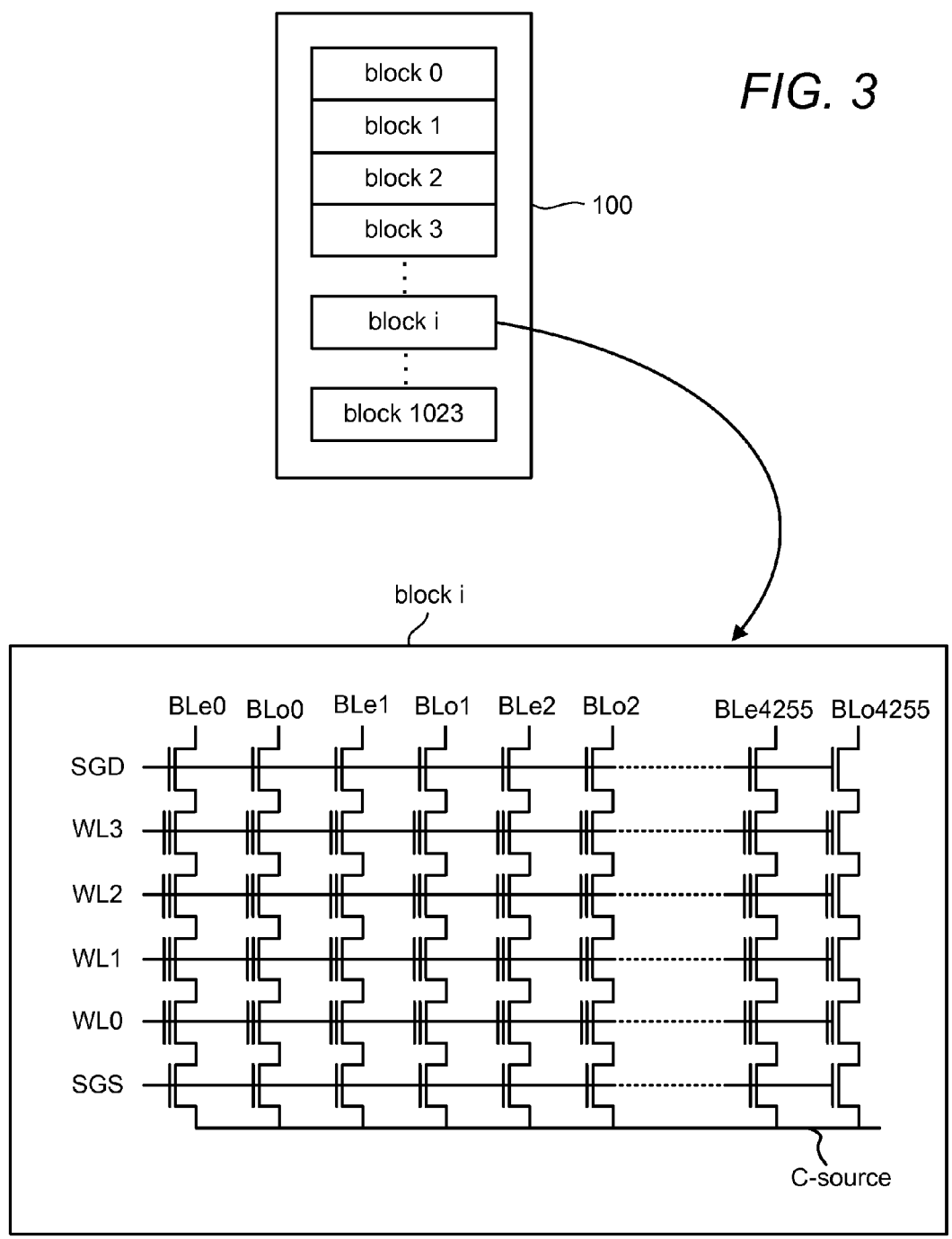
FIG. 3 is a block diagram of an exemplary array of NAND flash storage elements.

One example of a flash memory system uses the NAND structure, which includes multiple transistors arranged in series between two select gates. The transistors in series and the select gates are referred to as a NAND string. FIG. 1 is a top view showing one NAND string 30. FIG. 2 is an equivalent circuit thereof. The NAND string depicted in FIGS. 1 and 2 includes four transistors 10, 12, 14 and 16 in series between a first select gate 12 and a second select gate 22. Select gate 12 connects the NAND string to bit line 26. Select gate 22 connects the NAND string to source line 28. Select gate 12 is controlled by applying appropriate voltages to control gate 20CG via selection line SGD. Select gate 22 is controlled by applying the appropriate voltages to control gate 22CG via selection line SGS. Each of the transistors 10, 12, 14 and 16 includes a control gate and a floating gate, forming the gate elements of a memory cell. For example, transistor 10 includes control gate 10CG and floating gate 10FG. Transistor 12 includes control gate 12CG and a floating gate 12FG. Transistor 14 includes control gate 14CG and floating gate 14FG. Transistor 16 includes a control gate 16CG and a floating gate 16FG. Control gate 10CG is connected to word line WL3, control gate 12CG is connected to word line WL2, control gate 14CG is connected to word line WL1, and control gate 16CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string. Relevant examples of NAND-type flash memories and their operation are provided in the following U.S. Patents/Patent Applications, all of which are incorporated herein by reference in their entirety: U.S. Pat. Nos. 5,570,315; 5,774,397; 6,046,935; 5,386,422; 6,456,528; and U.S. patent application Ser. No. 09/893,277 (Publication No. US2003/0002348). Other types of non-volatile memory in addition to NAND flash memory can also be used in accordance with embodiments.

Typical architectures for flash memory using NAND structures include many NAND strings. FIG. 3 illustrates an exemplary array 100 of NAND strings, such as those shown in FIGS. 1-2. The array 100 of memory cells is divided into a large number of blocks of memory cells. As is common for flash EEPROM systems, the block is the unit of erase and may be referred to as an erase block or physical block. Each block can contain the minimum number of memory cells that are erased together, although multiple blocks may be erased simultaneously. Smaller units of cells may be erased together in some implementations.

Each block of memory cells includes a set of bit lines forming columns and a set of word lines forming rows. Each block is typically divided into a number of pages. A page is typically a minimum unit of programming or reading, although more than one page may be programmed or read in a single operation. In another embodiment, the individual pages may be divided into segments and the segments may contain the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than those of the user data to which they pertain. A sector of user data is typically 512 bytes, corresponding to the size of a sector commonly used in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Figure 4:
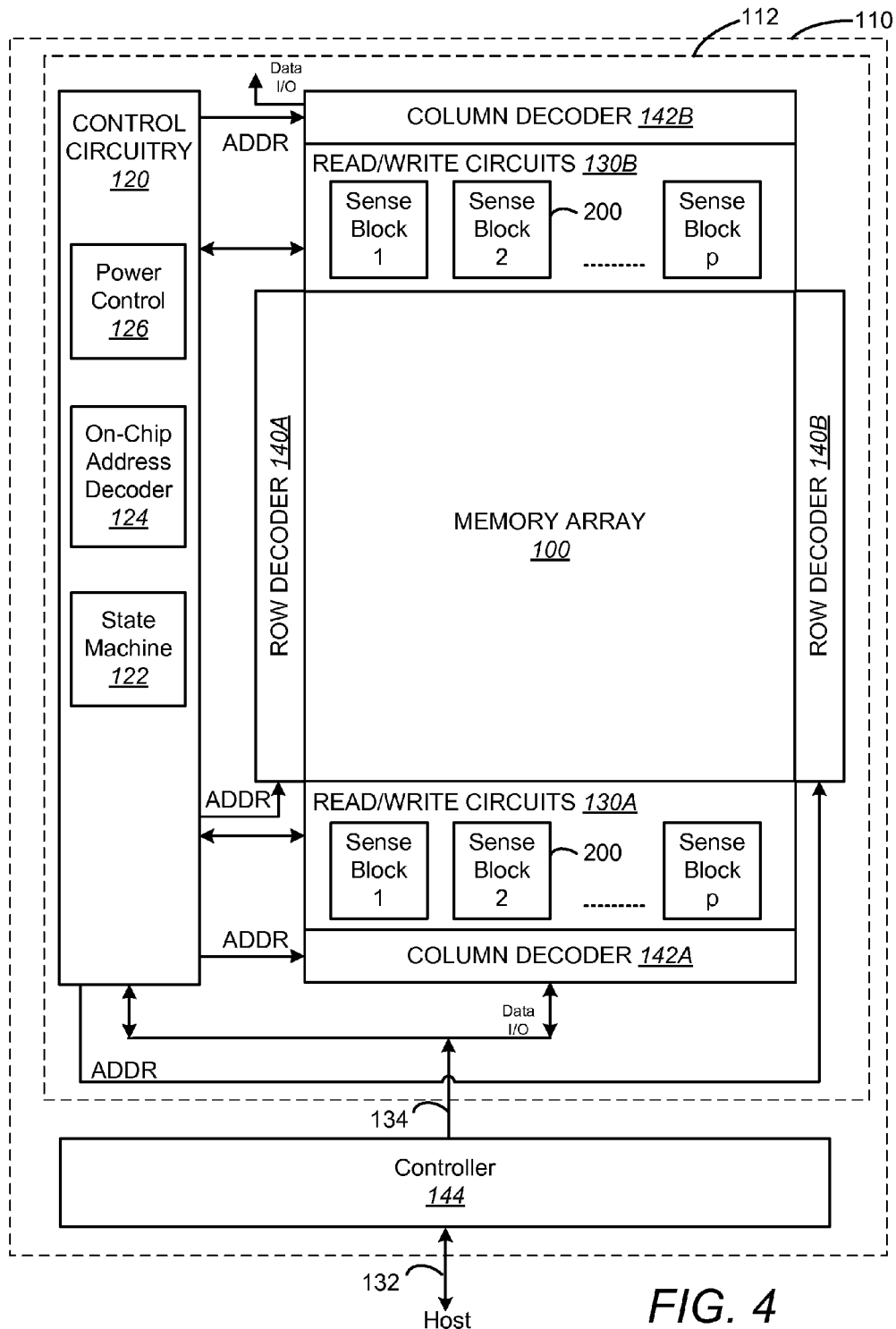
FIG. 4 is a block diagram of a non-volatile memory system in accordance with one embodiment.

Although four cells are included in each NAND string of FIG. 4, more or less than four can be used (e.g., 16, 32, or another number). One terminal of the NAND string is connected to a corresponding bit line via a first select gate (connected to select gate drain line SGD), and another terminal is connected to a common source line c-source via a second select (connected to select gate source line SGS). In each block of this example, there are 8,512 columns that are divided into even columns and odd columns. The bit lines are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. In this example, 532 bytes of data can be read or programmed simultaneously and forms a logical page. Therefore, one block can store at least eight pages. When each memory cell stores two bits of data, a block would store 16 pages. Other sized blocks and pages can also be used, and architectures other than those of FIGS. 1-3 can be used in accordance with the present disclosure.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

FIG. 4 illustrates a memory device 110 having read/write circuits for reading and programming a page of memory cells in parallel. Memory device 110 may include one or more memory die or chips 112. Memory die 112 includes a two-dimensional array of memory cells 100, control circuitry 120, and read/write circuits 130A and 130B. In the embodiment of FIG. 4, access to the memory array 100 by the various peripheral circuits is implemented in a symmetric fashion, on opposite sides of the array, so that the densities of access lines and circuitry on each side are reduced by half. In other embodiments, the various peripheral circuits may be provided in a non-symmetric fashion on single sides of the array. The read/write circuits 130A and 130B include multiple sense blocks 200 which allow a page of memory cells to be read or programmed in parallel. The memory array 100 is addressable by word lines via row decoders 140A and 140B and by bit lines via column decoders 142A and 142B. In a typical embodiment a controller 144 is included in the same memory device 110 (e.g., a removable storage card or package) as the one or more memory die 112. Commands and data are transferred between the host and controller 144 via lines 132 and between the controller and the one or more memory die 112 via lines 134.

The control circuitry 120 cooperates with the read/write circuits 130A and 130B to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140A, 140B, 142A, and 142B. The power control module 126 controls the power and voltages supplied to the word lines and bit lines during memory operations.

Figure 5:
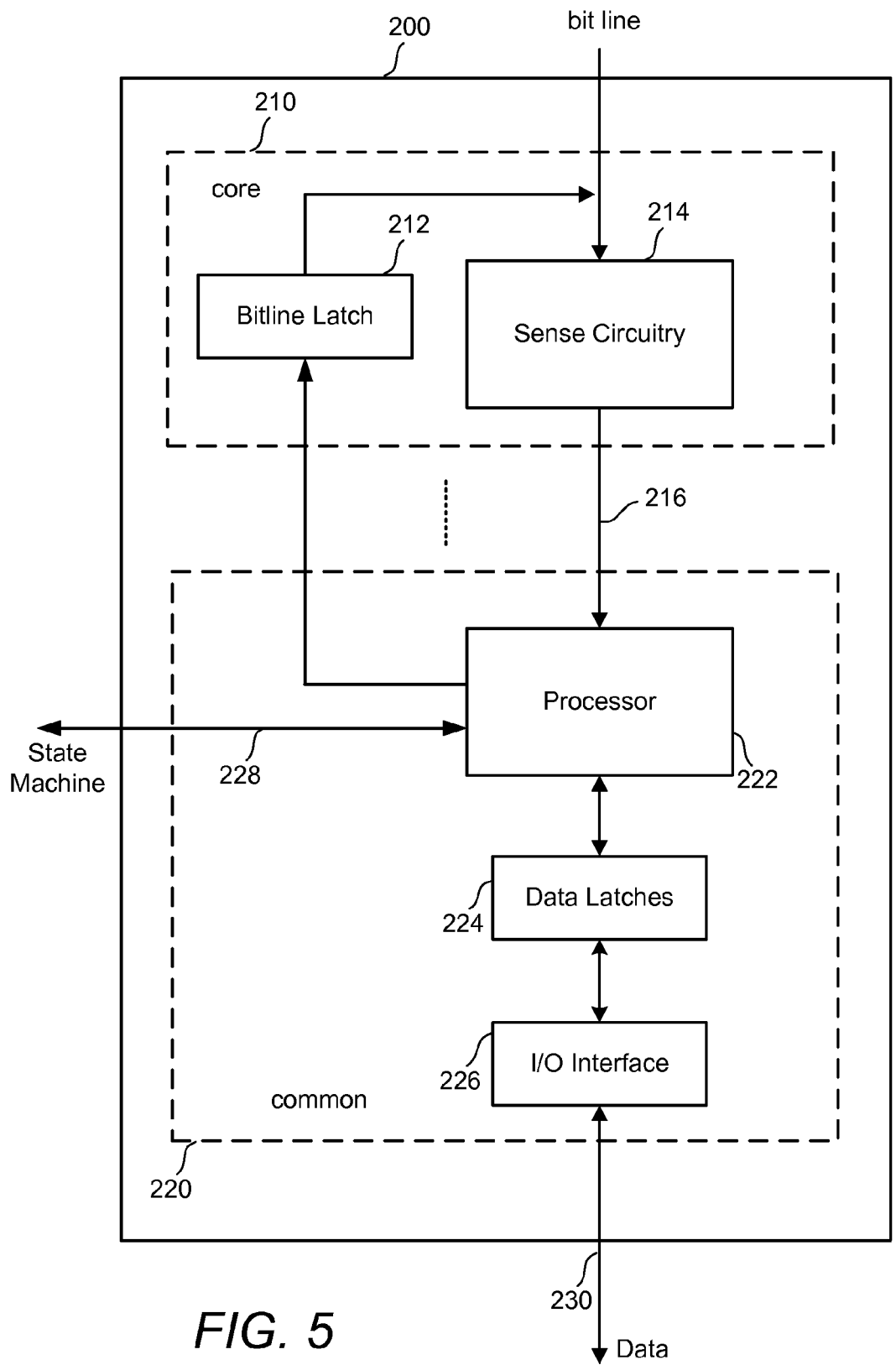
FIG. 5 is a block diagram of a sense block in accordance with one embodiment.

FIG. 5 is a block diagram of an individual sense block 200 partitioned into a core portion, referred to as a sense module 210, and a common portion 220. In one embodiment, there is a separate sense module 210 for each bit line and one common portion 220 for a set of multiple sense modules 210. In one example, a sense block will include one common portion 220 and eight sense modules 210. Each of the sense modules in a group will communicate with the associated common portion via a data bus 216. For further details refer to U.S. patent application Ser. No. 11/026,536 "Non-Volatile Memory & Method with Shared Processing for an Aggregate of Sense Amplifiers" filed on Dec. 29, 2004, which is incorporated herein by reference in its entirety.

Sense module 210 comprises sense circuitry 214 that determines whether a conduction current in a connected bit line is above or below a predetermined threshold level. Sense module 210 also includes a bit line latch 212 that is used to set a voltage condition on the connected bit line. For example, a predetermined state latched in bit line latch 212 will result in the connected bit line being pulled to a state designating program inhibit (e.g., $V_{DD}$).

Common portion 220 comprises a processor 222, a set of data latches 224 and an I/O Interface 226 coupled between the set of data latches 224 and data bus 230. Processor 222 performs computations. For example, one of its functions is to determine the data stored in the sensed memory cell and store the determined data in the set of data latches. The set of data latches 224 is used to store data bits determined by processor 222 during a read operation. It is also used to store data bits imported from the data bus 230 during a program operation. The imported data bits represent write data meant to be programmed into the memory. Data read from a cell is stored in the set of data latches before being combined with additional data and sent to the controller via I/O interface 226.

During read or sensing, the operation of the system is under the control of state machine 122 that controls the supply of different control gate voltages to the addressed cell. As it steps through the various predefined control gate voltages corresponding to the various memory states supported by the memory, the sense module 210 may trip at one of these voltages and an output will be provided from sense module 210 to processor 222 via bus 216. At that point, processor 222 determines the resultant memory state by consideration of the tripping event(s) of the sense module and the information about the applied control gate voltage from the state machine via input lines 228. It then computes a binary encoding for the memory state and stores the resultant data bits into data latches 224. In another embodiment of the core portion, bit line latch 212 serves double duty, both as a latch for latching the output of the sense module 210 and also as a bit line latch as described above.

During program or verify, the data to be programmed is stored in the set of data latches 224 from the data bus 230. The program operation, under the control of the state machine, comprises a series of programming voltage pulses applied to the control gates of the addressed memory cells. Each programming pulse is followed by a read back (verify) to determine if the cell has been programmed to the desired memory state. Processor 222 monitors the read back memory state relative to the desired memory state. When the two are in agreement, the processor 222 sets the bit line latch 212 so as to cause the bit line to be pulled to a state designating program inhibit. This inhibits the cell coupled to the bit line from further programming even if programming pulses appear on its control gate. In other embodiments the processor initially loads the bit line latch 212 and the sense circuitry sets it to an inhibit value during the verify process.

Data latch stack 224 contains a stack of data latches corresponding to the sense module. In one embodiment, there are at least four data latches per sense module 210 to store four bits of data for/from a cell. In some implementations (but not required), the data latches are implemented as a shift register so that the parallel data stored therein is converted to serial data for data bus 230, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Pat. No. 11/015,199 titled "Improved Memory Sensing Circuit And Method For Low Voltage Operation," Inventor Raul-Adrian Cernea, filed on Dec. 16, 2004; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cemea, filed on Dec. 28, 2005. All five of the immediately above-listed patent documents are incorporated herein by reference in their entirety.

Figure 6:
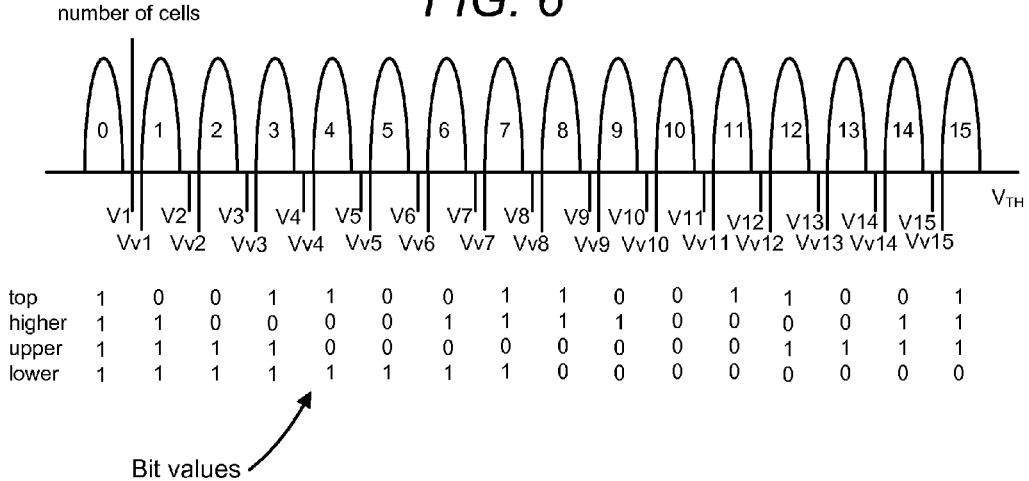
FIG. 6 is a graph depicting an exemplary distribution of threshold voltages for a population of memory cells, each storing four bits of data.

FIG. 6 is a graph depicting exemplary threshold voltage distributions for a group of memory cells when each memory cell stores four bits of data. Sixteen distinct threshold voltage ranges define sixteen memory states denoted 0-15. A first threshold voltage distribution is designated state 0 and includes erased memory cells having a threshold voltage less than 0V. The remaining threshold voltage distributions are designated states 1-15 and include memory cells programmed to within one of the threshold voltage ranges. In some embodiments, additional ones of states 1-15 may also correspond to negative threshold voltage ranges. For example, some implementations may adjust the source and body bias when at the lower states to provide positive voltage operating ranges.

Each distinct threshold voltage range of FIG. 6 corresponds to predetermined values for the set of data bits. The specific relationship between the data programmed into a memory cell and the corresponding threshold voltage level of the cell depends upon the adopted data encoding scheme. For instance, data values are often assigned to the different threshold voltage ranges using a gray code assignment so that if the threshold voltage of a floating gate erroneously shifts to a neighboring physical state, only one bit will be affected. In other embodiments, however, gray coding is not used. FIG. 6 sets forth one example for assigning data bits to the different threshold voltage ranges when each memory cell stores 4 bits of data. In FIG. 6, the different bits are uniquely identified as top, higher, upper, or lower, where the lower bit is the most significant bit and the top bit is the least significant bit. This designation is exemplary only. Furthermore, while FIG. 6 shows 16 states, other structures and arrangements, including those that include more or less than four states, can be used in accordance with the present disclosure.

The encoded data bits corresponding to each state are set forth below the graph of distributions. State 0 stores a 1 for each bit position, including the top, higher, upper and lower bits. State 1 stores a 0 for the top bit position and a 1 in each remaining bit position. As mentioned previously, the data bits represented by the programming state of a storage element can be considered as a code word. With sixteen states for example, a four bit code word can be used.

When reading non-volatile memory, at least one reference threshold voltage level is generally established between each state so as to partition the threshold voltage memory window of the memory cell into the number of ranges used. The threshold voltage of a cell can be compared to the various reference levels, also referred to as compare points, to determine the memory state of the cell. Predetermined, fixed voltages (e.g., read reference voltages) that correspond to the reference threshold voltage levels can be applied to a cell's gate, and its source/drain conduction state established by comparing the conduction with a breakpoint level or reference current.

FIG. 6 shows fifteen read compare points V1-V15 for reading data from the memory cells. By testing whether the threshold voltage of a given memory cell is above or below the various compare points, the system can determine what state the memory cell is in. If a memory cell conducts with V1 applied to its control gate, then the memory cell is in state 0. If a memory cell conducts at V2 but not at V1, then the memory cell is in state 1. If the memory cell conducts at V3 but not at V2, then the memory cell is in state 2. If the memory cell conducts at V4 but not at V3, then the memory cell is in state 3. If the memory cell conducts at V5 but not at V4, then the memory cell is in state 3. If the memory cell conducts at V6 but not at V5, then the memory cell is in state 5. If the memory cell conducts at V7 but not at V6, then the memory cell is in state 6. If the memory cell conducts at V8 but not at V7, then the memory cell is in state 7. If the memory cell conducts at V9 but not at V8, then the memory cell is in state 8. If the memory cell conducts at V10 but not at V9, then the memory cell is in state 9. If the memory cell conducts at V11 but not at V10, then the memory cell is in state 10. If the memory cell conducts at V12 but not at V11, then the memory cell is in state 11. If the memory cell conducts at V13 but not at V12, then the memory cell is in state 12. If the memory cell conducts at V14 but not at V13, then the memory cell is in state 13. If the memory cell conducts at V15 but not at V14, then the memory cell is in state 14. If the memory cell does not conduct at any of the compare voltage levels, the memory cell is in state 15.

FIG. 6 also shows fifteen verify compare points Vv1-Vv15. When programming memory cells to state 1, the system tests whether those memory cells have a threshold voltage greater than or equal to Vv1. When programming memory cells to state 2, the system tests whether the memory cells have threshold voltages greater than or equal to Vv2, etc.

Figure 7:
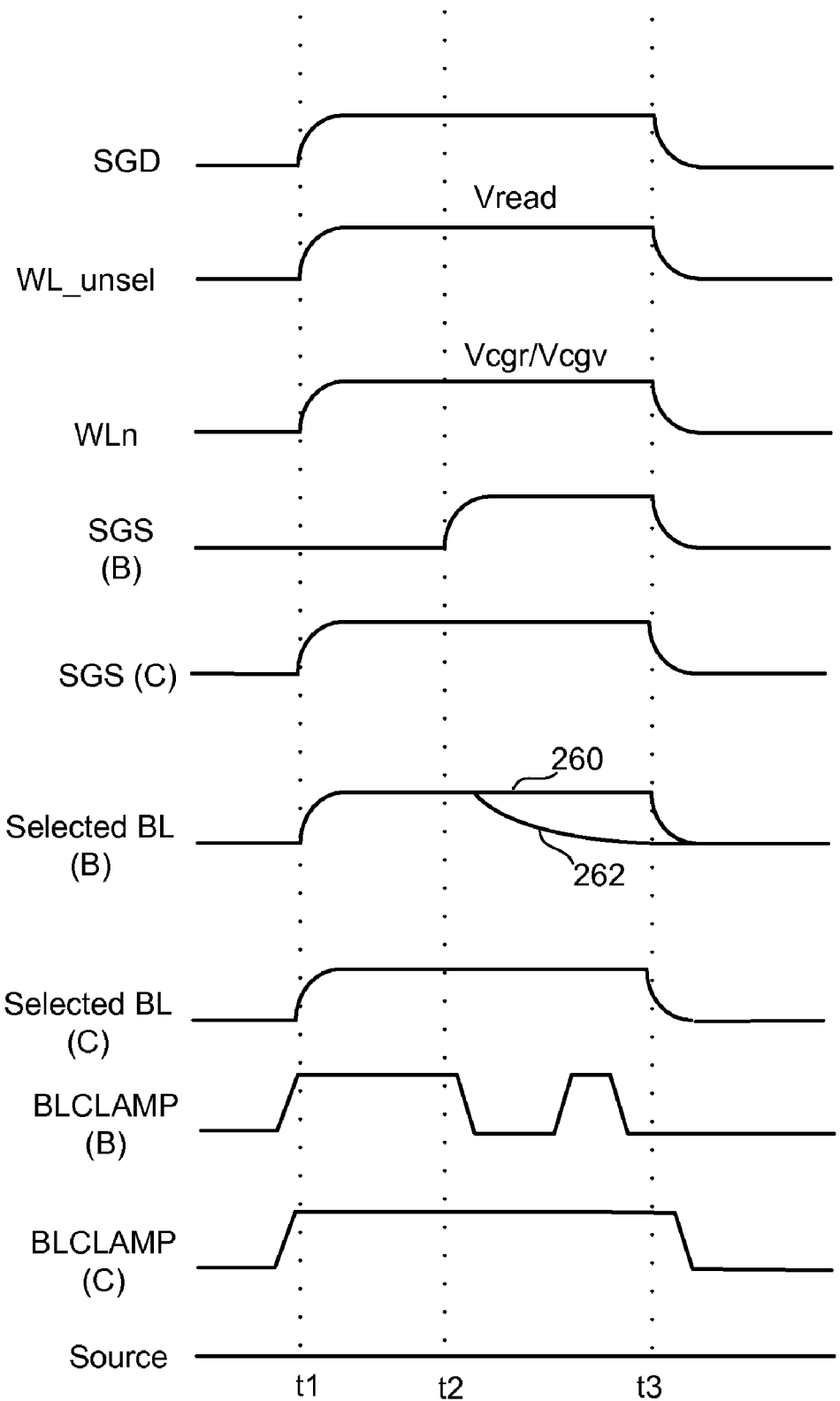
FIG. 7 is a timing diagram that explains the behavior of certain signals during read/verify operations.

FIG. 7 is a timing diagram depicting the behavior of various signals during one iteration of an exemplary read or verify process. Each iteration of the process of FIG. 7 represents a single sense operation for each cell memory. If the memory cells are binary memory cells, the process of FIG. 7 may be performed once. If the memory cells are multi-state memory cells with four states (e.g., 0, 1, 2, and 3), the process may be performed three times (three sense operations) for each memory cell (generally in parallel).

During read and verify operations the selected word line (e.g., WL2 of FIG. 3) is typically connected to a read reference voltage Vcgr, a level of which is specified for each read and verify operation in order to determine whether a threshold voltage of the concerned memory cell has reached such level. The select gates of a selected block are raised to one or more select voltages and the unselected word lines (e.g., WL0, WL1 and WL3 of FIG. 3) of the selected block are raised to a read pass voltage Vread (e.g., 4.5 volts) to make the transistors operate as pass gates. After applying the word line voltage, the conduction current of the memory cell is measured to determine whether the memory cell turned on in response to the voltage applied to the word line. If the conduction current is measured to be greater than a particular value, then it is assumed that the memory cell turned on and the voltage applied to the word line is greater than the threshold voltage of the memory cell. If the conduction current is not measured to be greater than the particular value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges a dedicated capacitor in the sense amplifier. In another example, the conduction current of the selected memory cell allows (or fails to allow) the NAND string that included the memory cell to discharge the bit line. The charge on the bit line is measured after a period of time to see whether it has been discharged or not.

FIG. 7 shows signals SGD, WL_unsel. WLn+1, WLn, SGS, Selected BL, BLCLAMP, and Source starting at Vss (approximately 0 volts). SGD is the gate selection line of the drain side select gate. SGS is the gate selection line of the source side select gate. WLn is the word line selected for reading/verification. WLn+1 is the unselected word line that is the drain side neighboring word line to WLn. WL_unsel represents the unselected word lines other than the drain side neighboring word line. Selected BL is the bit line selected for reading/verification. Source is the source line for the memory cells (see FIG. 3). BLCLAMP is an analog signal that sets the value of the bit line when charged from the sense amplifier.

In FIG. 7, the sensing circuits measure the conduction current of a memory cell by determining whether the bit line has discharged. At time t1, SGD is raised to VDD (e.g., approximately 3.5 volts), the unselected word lines (WL_unsel) are raised to Vread (e.g., approximately 5.5 volts), the selected word line WLn is raised to Vcgr (e.g., V1, V2 . . . V15) for a read operation or a verify level Vcgv (e.g., Vv1, Vv2 . . . Vv15) for a verify operation, and BLCLAMP is raised to a pre-charging voltage to pre-charge the selected bit line Selected BL (e.g., to approximately 0.7V). The voltage Vread acts as a pass voltage, causing the unselected memory cells to turn on regardless of physical state or threshold voltage and act as pass gates. At time t2, BLCLAMP is lowered to Vss so the NAND string can control the bit line. Also at time t2, the source side select gate is turned on by raising SGS to $V_{DD}$. This provides a path to dissipate the charge on the bit line. If the threshold voltage of the memory cell selected for reading is greater than Vcgr or Vcgv applied to the selected word line WLn, then the selected memory cell will not turn on and the bit line will not discharge, as depicted by signal line 260. If the threshold voltage in the memory cell selected for reading is below Vcgr or Vcgv applied to the selected word line WLn, then the memory cell selected for reading will turn on (conduct) and the bit line voltage will dissipate, as depicted by curve 262. At some point after time t2 and prior to time t3 (as determined by the particular implementation), the sense amplifier will determine whether the bit line has dissipated a sufficient amount. In between t2 and t3, BLCLAMP (B) is raised to let the sense amplifier measure the evaluated BL voltage and then lowered. At time t3, the depicted signals will be lowered to Vss (or another value for standby or recovery). Note that in other embodiments, the timing of some of the signals can be changed (e.g. shift the signal applied to the neighbor).

Figure 8:
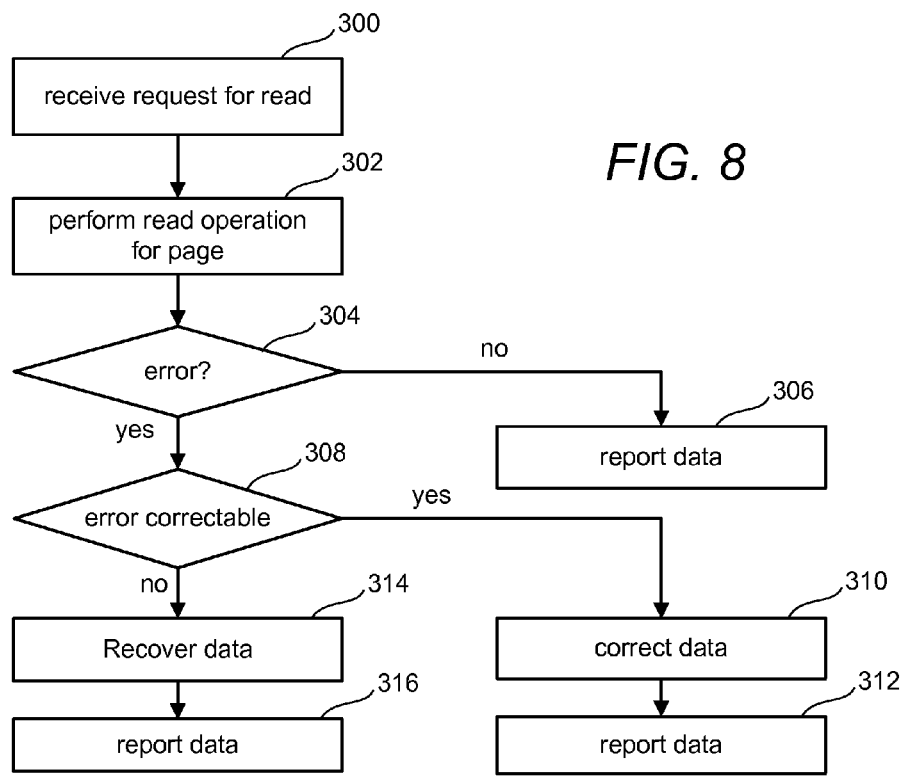
FIG. 8 is a flow chart describing one embodiment of a process for reading non-volatile memory.

FIG. 8 is a flow chart describing one embodiment for reading data from non-volatile memory cells. FIG. 8 provides the read process at the system level. At step 300, a request to read data is received. At step 302, a read operation is performed for a particular page in response to the request to read data. In one embodiment, when data for a page is programmed, the system will also create extra bits used for Error Correction Codes (ECCs) and write those ECC bits along with the page of data. When reading data from a page, the ECC bits will be used to determine whether there are any errors in the data at step 304. The ECC process can be performed by the controller, the state machine or elsewhere in the system. If there are no errors in the data, the data is reported to the user at step 306. If an error is found at step 304, it is determined whether the error is correctable at step 308. The error may be due to floating gate to floating gate coupling or other reasons. Various ECC methods have the ability to correct a predetermined number of errors in a set of data. If the ECC process can correct the data, then the ECC process is used to correct that data at step 310 and the data, as corrected, is reported to the user at step 312. If the data is not correctable by the ECC process, a data recovery process may be performed at step 314. In some embodiments, an ECC process will be performed after step 314. After the data is recovered, that data is reported to the host at step 316. The process can continue by reading additional pages if necessary while reporting data to the host.

Figures 9, 10:
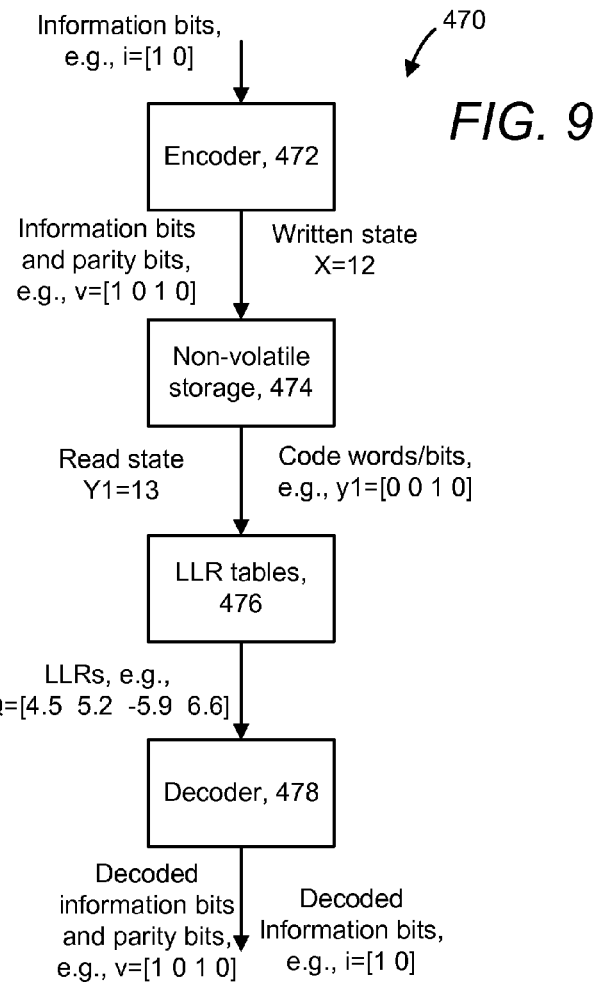
FIG. 9 is a block diagram of an error correction control system in accordance with one embodiment.
FIG. 10 is a table that provides exemplary initial LLR values for each bit of a code word or unit of data based on a hard read result.

FIG. 9 depicts a system for encoding and decoding data for non-volatile storage that can be used in accordance with one embodiment. Error correction controls are employed to detect and correct readings of erroneous or corrupted data in the non-volatile memory array. Generally speaking, some additional ECC or parity bits are calculated from the input data and stored in the memory array according to an encoding scheme. When reading, the input data and ECC bits are both read, and a decoder uses both to detect whether errors are present and in some cases, in which bit(s) the errors occur.

The error correction control system of FIG. 9 can be implemented as part of controller 144 in one embodiment, although different systems and architectures can be used. The system of FIG. 9 includes an encoder 472, memory array 474, LLR (logarithmic likelihood ratio) tables 476 and a decoder 478. The encoder 472 receives user data, also referred to as information bits, that is to be stored in memory array 474. The informational bits are represented by the matrix i=[1 0]. The encoder 402 implements an error correction coding process in which parity bits are added to the informational bits to provide data represented by the matrix or code word v=[1 0 1 0], indicating that two parity bits have been appended to the data bits. Other techniques, such as those discussed hereinafter, can be used that map input data to output data in more complex manners. Low density parity check (LDPC) codes, also referred to as Gallager codes, can be used. In practice, such codes are typically applied to multiple pages encoded across a number of storage elements. Further information regarding LDPCs can be found in D. MacKay, Information Theory, Inference and Learning Algorithms, Cambridge University Press 2003, chapter 47. The data bits can then be mapped to a logical page and stored in the non-volatile storage 474 by programming a non-volatile storage element to a programming state, e.g., X=12, which corresponds to v. With a four-bit data matrix v, sixteen programming states can be used. Generally, parity bits are not used for each individual cell.

In one possible implementation, an iterative probabilistic decoding process is used which implements error correction decoding corresponding to the encoding implemented at the encoder 472. Further details regarding iterative probabilistic decoding can be found in the above-mentioned D. MacKay text. The iterative probabilistic decoding attempts to decode a code word by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables 476. LLR values are measures of the reliability with which the values of various binary bits read from the storage elements are known.

The LLR for a bit is given by $$Q = \log_2 \frac{P(v=0|Y)}{P(v=1|Y)},$$

where P(v=0|Y) is the probability that a bit is a 0 given the condition that the read state is Y, and P(v=1|Y) is the probability that a bit is a 1 given the condition that the read state is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the four bit positions in the codeword y1. For example, LLRs of 4.5, 5.2, −5.9 and 6.6 are assigned to bits 0, 0, 1 and 0, respectively, of y1. Further, the LLR tables can account for the multiple read results so that an LLR of greater magnitude is used when the bit value is consistent in the different code words.

The decoder 478 receives the code word y1 and the LLRs. As explained below (see e.g., FIGS. 11 and 12), the decoder 478 iterates in successive iterations in which it determines if parity checks of the error encoding process have been satisfied. If all parity checks have been satisfied, the decoding process has converged and the code word has been error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of y1 is completed to obtain the decoded information including parity bits v and the decoded information bits i.

FIG. 10 is a table of initial LLR values for each bit position of the different states for a device as illustrated in FIG. 6. A positive LLR value indicates a logical 0 for the corresponding bit and a negative LLR indicates a logical 1 for the corresponding bit. A greater magnitude indicates a greater reliability or probability with respect to the bit being in that logical state. For example, the lower bits in states 0 through 5 might have an LLR=−58, to indicate that these bits have a high probability of being a 1. That can be seen intuitively from FIG. 6, since the probability that reading a cell as in state Y1 that is actually in a programmed state far enough away to change the bit from a 0 to a 1 is small. Thus, the LLR for the lower bit for state 5 is −M3 (higher probability of correctness) since the read state would have to be off by at least three states from the programmed state, e.g., state 8 (where the lower bit is 0, not 1). However, the LLR for the lower bit for state 6 is of a lower magnitude −M2 (e.g., −24) (intermediate probability of correctness) since the read state would have to be off by two states for the bit to be errored. Similarly, the LLR for the lower bit for state 7 is of an even lower magnitude −M1 (e.g., −1) (lower probability of correctness) since the read state would have to be off by only one state for the bit to be errored. Similar reasoning applies to the other bit positions. For example, the LLRs for the top bits indicate a relatively low probability of correctness since an error of only one state would result in the bit being incorrect.

Figures 11, 12:
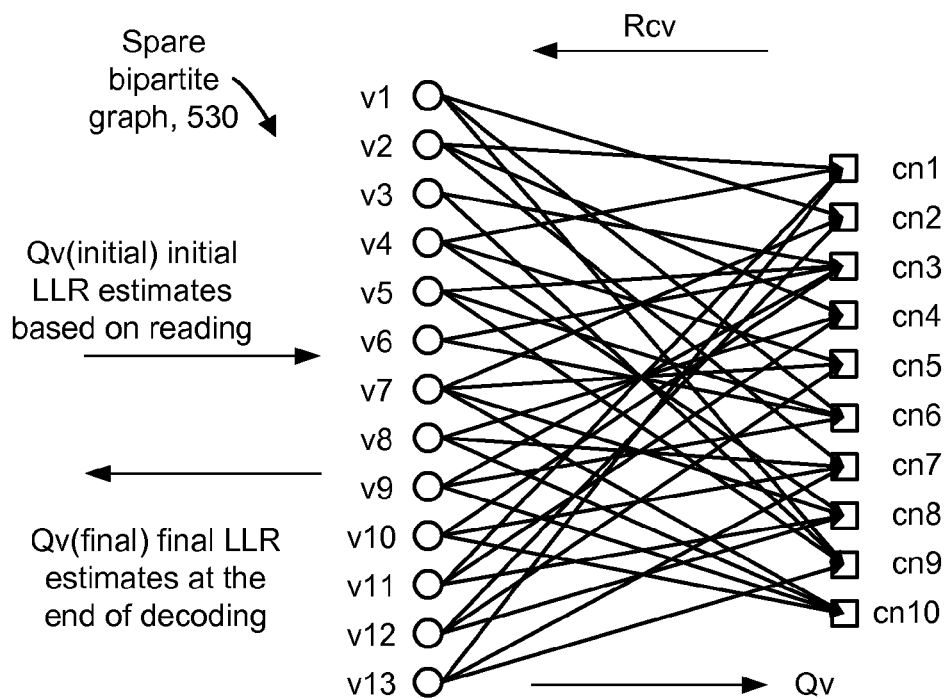
FIG. 11 depicts an exemplary sparse parity check matrix.
FIG. 12 depicts a sparse bipartite graph which corresponds to the sparse parity check matrix of FIG. 11.

FIG. 11 depicts a sparse parity check matrix. As mentioned previously, the memory stores data which represents informational bits and parity bits (or ECC bits), where the parity bits are provided according to an error correction coding process. Such as process involves adding parity bits to information bits. In one possible approach, a low density parity check (LDPC) code may be used. In practice, such codes are typically applied to multiple code words which are encoded across a number of storage elements (i.e., not every cell stores parity bits, the check being distributed across multiple cells). LDPC codes are desirable because they incur a relatively low overhead cost. Moreover, LDPC codes exhibit a performance near the Shannon limit under iterative message-passing decoding algorithms. However, this is an example implementation only, as any types of error correction code can be used as well. For example, other linear block codes may be used.

An LDPC code is a linear block code which is characterized by a sparse parity check matrix, e.g., as depicted by the matrix 520. The matrix includes K information bits and M parity bits, and the code length is N=K+M. Further, the parity bits are defined such that M parity check equations are satisfied, where each row of the matrix represents a parity check equation. In particular, the rows of the matrix are identified by check nodes cn1 through cn10 and the columns are identified by variables v1 through v13, which indicate the data that is stored in the storage elements, e.g., the code word bits. This data includes information bits i and parity bits p, based on the equation:

$$H \cdot \overline{v} = H \cdot \left[ \frac{i}{p} \right] = 0,$$

where H is the sparse parity check matrix, v is the data matrix, i is the information bit matrix and p is the parity bit matrix. The data matrix v can be determined by solving the above equation. Further, this can be done efficiently using a Gaussian elimination procedure if the matrix H is lower triangular.

FIG. 12 depicts a sparse bipartite graph which corresponds to the sparse parity check matrix of FIG. 11. The graph 530 indicates in further detail how the LDPC code works. The variable nodes v1 through v13 represent the code word bits and the check nodes cn1 through cn10 represent the parity check constraints on the bits. The variable nodes receive as input $Q_{v(initial)}$ the initial LLR bit estimates resulting from the read operation of the flash memory cells.

During decoding, the decoder attempts to satisfy the parity checks. In this example, there are ten parity checks as indicated by the check nodes cn1 through cn10. The first parity check at cn1 determines if v2⊗v4⊗v11⊗v13=0, where ⊗ denotes the exclusive-or (XOR) logical operation. For simplicity, the following discussion is provided with respect to binary bits, which can take the values of 0 or 1. For an actual implementation, the bits can be LLR values, where a positive LLR represents binary 0, and a negative LLR represents binary 1. Moreover, instead of using a typical XOR logical operation a "soft XOR" can be used in implementations. A soft XOR operation operates on analog LLR values and returns an analog value. Soft XOR operations on LLR values reduce to logical XOR operations on binary bits, if we reduce positive LLR values to binary 0s and negative LLR values to binary 1s. This check is satisfied if there is an even number of "1" bits in v2, v4, v11 and v13. This check is denoted by the fact that arrows from nodes v2, v4, v11 and v13 point to node cn1 in the graph 530. The second parity check at cn2 determines if v1⊗v7⊗v12=0, which is satisfied if there is an odd number of "1" bits. The third parity check at cn3 determines if v3⊗v5⊗v6⊗v9⊗v10=0, which is satisfied if there is an odd number of "1" bits. Similarly, the fourth parity check at cn4 determines if v2⊗v8⊗v11=0, the fifth parity check at cn5 determines if v4⊗v7⊗v12=0, the sixth parity check at cn6 determines if v1⊗v5⊗v6⊗v9=0, the seventh parity check at cn7 determines if v2⊗v8⊗v10⊗v13=0, the eighth parity check at cn8 determines if v4⊗v7⊗v11⊗v12=0, the ninth parity check at cn9 determines if v1⊗v3⊗v5⊗v13=0 and the tenth parity check at cn01 determines if v7⊗v8⊗v9⊗v10=0.

The decoding process for LDPC is an iterative probabilistic decoding process known as iterative message passing decoding. Iterating involves serially traversing the check nodes and updating the LLR values of the bits involved based on each parity check. In one approach, an attempt is made to satisfy the first parity check of cn1. Once that parity check is satisfied, an attempt is made to satisfy the first parity check of cn2 and so forth. In another embodiment, after an unsuccessful attempt at cn1, the process moves to cn2 and comes back to cn1. The LLR values can be adjusted, if necessary, for each iteration in various manners known to those skilled in the art.

This iterative algorithm is a form of belief propagation. Updates to the LLR values from the check nodes to the variable nodes are indicated in FIG. 12 as Rcv. Rc1v13, for example, indicates an adjustment to the LLR value originating at node v13. The update provided to variable node v13 after the parity check at node c1 is based on a Soft XOR operation: v13=v2+v4+v11. The LLR value for each variable node is updated after the check. An update Rc1v1 is provided to variable node v1, an update Rc1v3 is provided to variable node v3, and an update Rc2v11 is provided to variable node 11.

Error correction control algorithms in non-volatile memory systems have traditionally been based on belief propagation theories whereby the algorithm seeks to move in the direction of lower error. That is to say, adjustments to the parity check results or LLR results are only made so as to decrease the overall error. These simple propagation algorithms that always move towards lower error may not provide the most efficient convergence and in some instances, may even prevent convergence for non-volatile memory.

Figure 13:
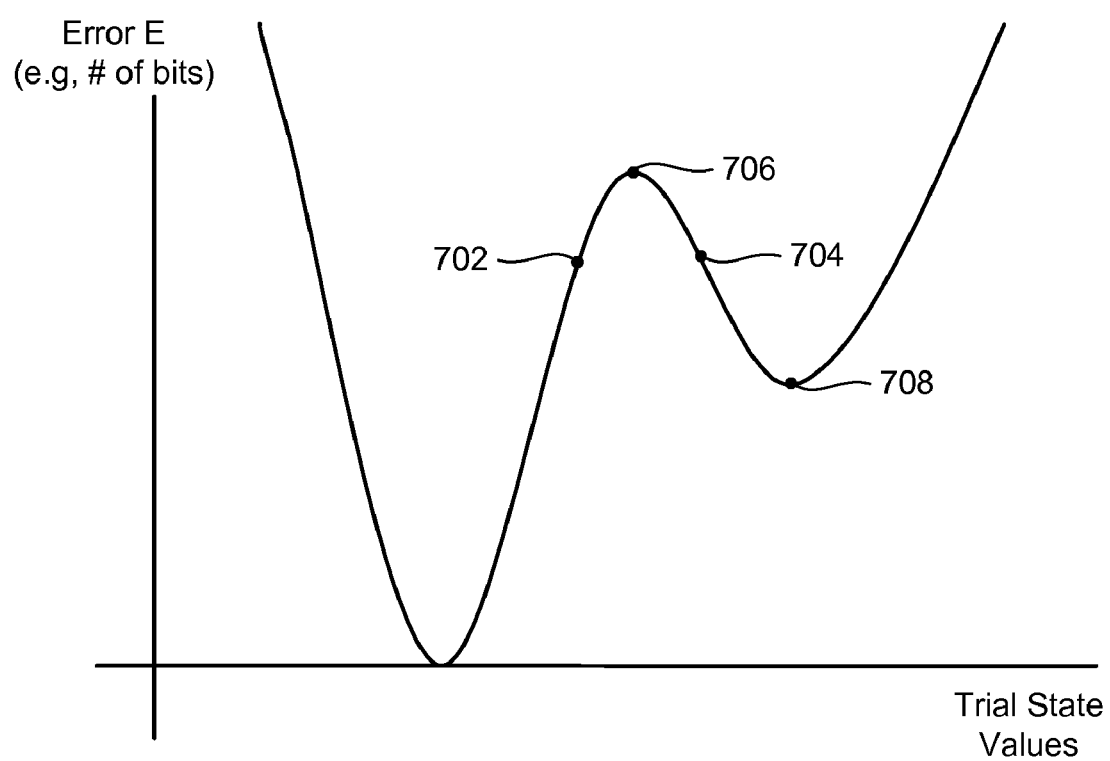
FIG. 13 is a graph describing error as a function of trail state values for an exemplary memory system.

Consider the graph shown in FIG. 13 which illustrates the overall error E in the data being decoded by the system versus the different configurations of states (trial state values) that can be read from the cells corresponding to the data. There is a single point along the x-axis where the error E reaches 0, indicating a set of state information for the cells that satisfies the parity checks of the system. Consider the point 702 corresponding to a set of states Y1. The error is high for this configuration of data states. After performing a parity check, the error correction control will update the parity results and/or LLR values to reduce the overall error in the data. To do this, the algorithm adjusts the values incrementally and only in such a manner that error is decreased. At the point of iterative decoding when the state configuration of point 702 is tried, the algorithm will adjust the values so as to move left and down along the curve. Based on the parity check and data read from the cell, the correction control can determine the direction to move to achieve lower error and provide the necessary updated LLR values and/or parity results. While the algorithm in this instance should reach the correct state configuration, the incremental updates made to the parity results and LLR values may cause the propagation to that point proceed slowly. Some algorithms may provide small changes to the LLR values and parity results in an effort to avoid excessively overshooting the correct result.

Consider now the point 704, which also lies at a point of relatively high error E. Point 704 lies to the right of a local maximum error 706 and left of a local minimum error 708. After failing convergence at the state values for point 704, the correction algorithm will seek to move in the direction of lower error. In this case, the correction algorithm will determine that moving the trial states to the right decreases the overall error while moving the trial states to the left increases the overall error. Thus, a trial state to the right of point 704 will be tried and the error will decrease. This process will be repeated until the iterative decoding reaches the state configurations around the local minimum 708. First, the algorithm will make even smaller changes when approaching a point of the curve having a small slope. This is done because the algorithm interprets the decreasing slope as a sign that it is approaching the zero error point, which itself lies at a point of zero slop. Second, the algorithm will continually attempt to seek the direction of lower error and essentially oscillate about the local minimum 708. In such an instance the process will fail to reach convergence where all parity checks are met and thus, will fail to accurately decode the data.

Such a scenario can manifest itself when utilizing iterative probabilistic decoding in non-volatile memory error correction control. Consider the example of four bit cell under the encoding shown in FIG. 10. Suppose the bits stored by the cell were misread and the data for the cell was undergoing a parity check. If the LLR values of each bit were iteratively adjusted in increments of 3 to achieve parity by incrementing the top bit by −3 and the higher, upper and lower bits by +3 (each in the direction to cause a parity change of the individual bit), parity may never be reached in some cases. When the top bit changes its parity to −2 after the second iteration, the higher bit will change its parity in the opposite direction to +2. The net result is that the parity remains the same and the decoding may fail to converge.

Figure 14:
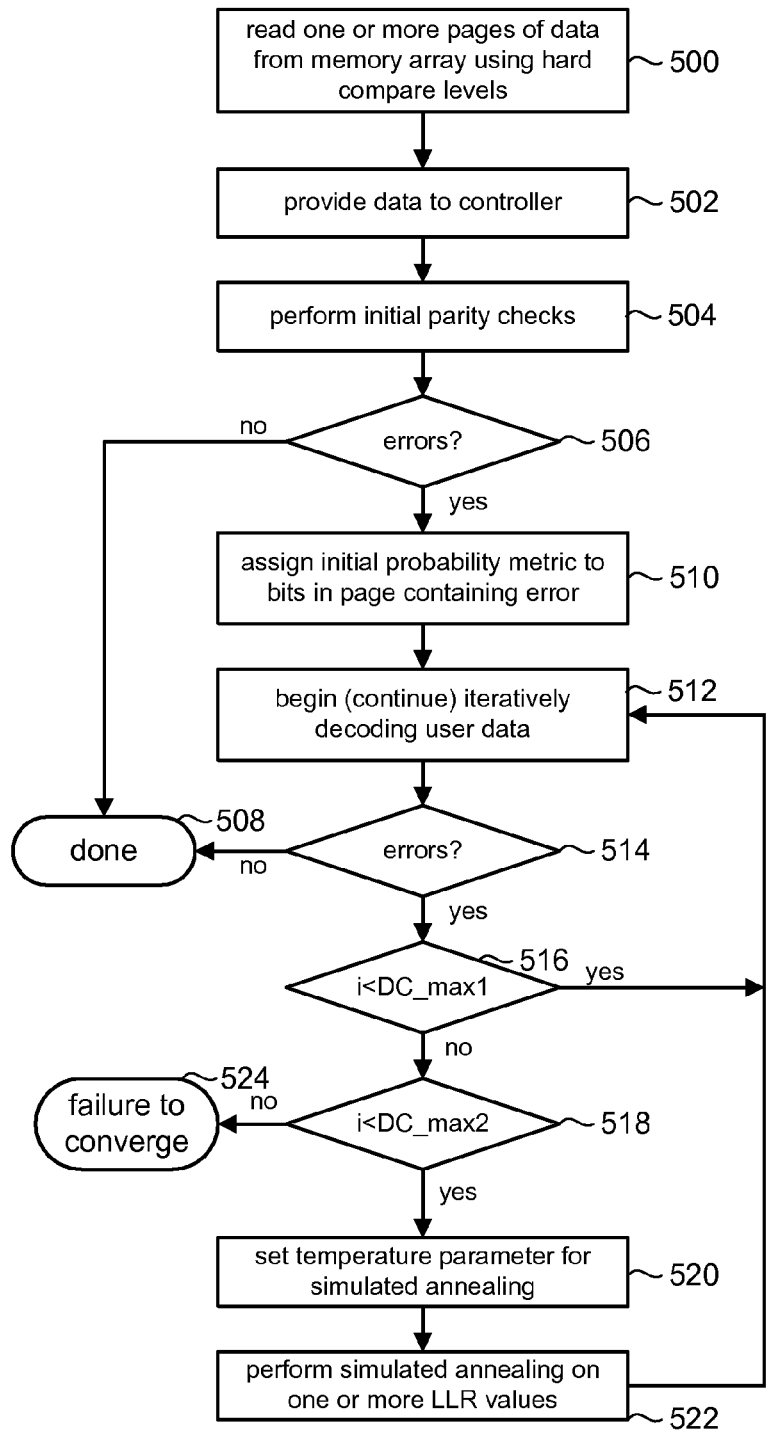
FIG. 14 is a flowchart describing a process for providing error correction control that includes simulated annealing in accordance with one embodiment.

FIG. 14 is a flowchart of a method for reading data from non-volatile memory in accordance with one embodiment that includes iterative decoding using reliability metrics as part of an error correction control process. A first table of initial LLR values is used to decode the data based on reading at the hard compare levels. These initial LLR values will later be adjusted during any needed correction processes in an effort to satisfy one or more parity checks, such as those described with respect to FIGS. 11 and 12. In one embodiment, simulated annealing is utilized in an effort to achieve quicker convergence for all parity checks and to achieve parity in situations where the correction may otherwise fail. The simulated annealing can be guided using knowledge about the non-volatile memory itself, including floating gate coupling, data retention, and other factors that may lead to erroneous readings. This simulated annealing may be more robust in non-volatile memory situations than in its other more applications such as communications. Because certain errors that arise from non-volatile memory reading are systematic, rather than Gaussian white noise as with most communication errors, the simulated annealing can be guided or tailored for a more refined approach to applying randomness to the system. For instance, the LLR values may be modified based on knowledge of the manner in which cells programmed to different states tend to change with respect to stored charge level over time. In this way, rather than injecting completely random changes as with simulated annealing in communications, a guided process of performing simulated annealing can be performed using a priori knowledge of systemic device behavior.

Referring again to FIG. 13, simulated annealing would allow the error-correcting process to move from state 704 at one iteration step to some probabilistically selected state in a range near state 704. Through the use of a guided process however, in another embodiment the algorithm does not necessarily require the introduction of a random component. Suppose that the initial read error for the case of FIG. 13 were caused by systemic behavior whose characteristics were incorporated into the algorithm. The guided non-annealing step would then move the algorithm from state 704 towards the global minimum by a deterministically selected distance. If this non-annealing step moved the trial state past point 706, then regular belief-propagation could then find the correct data.

At step 500, one or more pages of data are read from the memory array using the hard read compare levels to distinguish between the multiple states to which the cells may be programmed. Other units of data can be read in accordance with the disclosed principles. By way of example, a page of data might include each of the four bits from each cell of a group of cells. Other examples of pages might include a particular bit from each cell of a group of cells. Cells might be grouped according to word line or by word line and type of word line, for example. Depending on the nature of the operation performed at step 500 and the adopted encoding scheme, various hard compare levels can be applied. For instance, reading every bit from the cells might entail application of each compare level while reading the lower bit might be accomplished simply by applying the V8 compare level. At step 502, the data for the unit that was read is provided from the memory chip to the controller. For example, sequential pages of data are provided in one embodiment. At step 504, the data is decoded according to the encoding technique used when writing the data. For example, step 504 can include performing one or more parity checks on the data. If no errors are detected at step 506, the read operation completes at step 508. If one or more errors are detected however, error correction begins for the data in error at step 51 0. Error correction can be performed for various portions of the data that is read in step 500. Depending on the level at which the correction scheme can identify an error in the data, different sizes of data can undergo iterative probabilistic decoding.

An initial probability metric is assigned to each of the bits in each unit of data in which an error was detected at step 5 10. For example, a metric may be assigned to each bit in a number of error correction pages having a detected error. The metric assigned to each bit is an initial LLR value determined from a first LLR table in one embodiment. At step 512, iterative decoding of the data begins. The parity at a first check node can be assessed and the initial LLR values adjusted if parity is not met. The process can continue to a second check node if necessary and parity checked. As earlier described, the parity of select bits will eventually change during the iterative process with the goal of resulting parity at all check nodes. If no errors remain in the data at step 514, the read operation completes at step 508. If errors do remain, a counter i is checked against a predetermined maximum number of iterations DC_max1 at step 516. In one embodiment, step 514 is not performed during the first iteration through steps 512-522. So long as there are errors in the data and the counter is below the maximum number of iterations, the iterative decoding process continues at step 512.

Once the maximum number of iterations DC_max1 has been reached, simulated annealing is incorporated into the iterative decoding process to assist in reaching convergence with respect to every parity check. In other embodiments, simulated annealing can be performed from the start of decoding. Another check of the counter is made to determine whether i<DC_max2 at step 518. DC_max2 can establish a total number of iterations before determining that the data cannot be corrected even using simulated annealing. If I is less than DC_max2, the process continues at step 520. The process will continue to iterate, including the injection of some degree of randomness based on simulated annealing until convergence is reached at step 508 or until the maximum number of iterations DC_max2 is reached, in which case an failure is determined at step 524.

At step 520, a temperature parameter T is set to define the nature of the annealing simulation that will be performed. The temperature parameter T does not correspond to an actual temperature but rather, the notion of increasing a degree of randomness inserted into a process that is based on a parameter that is analogous to temperature in actual annealing processes. In one embodiment, the temperature parameter is established based on the amount of error detected in the system. For instance, the number of data bits determined to be in error at step 514 can be used to set the parameter. A larger number of bits will result in a higher value of T. In another embodiment, the temperature parameter is established based on the degree of reliability associated with the data bits (e.g., from an LLR table or the current iterative LLR values). A lower reliability will result in a higher value of the temperature parameter.

At step 522, simulated annealing is performed in a selected manner for the iterative decoding. It is noted that the performance of step 520 may be incorporated within step 512 in one embodiment. The simulated annealing will be performed according to the temperature parameter T which represents a degree of randomness to be introduced into the system.

In one embodiment, the simulated annealing provides a random adjustment to the LLR values that pass from the variable nodes to the parity check nodes. For instance, during one iteration at a first check node, the variable nodes connected with the check node provide either initial LLR values from a table or iterative LLR values from the last iteration. The simulated annealing process can alter the LLR values in a random or guided random manner to introduce randomness to the decoding process. In another embodiment, the random adjustment could be provided to the results at the parity check nodes. For instance, the simulated annealing could provide a random or guided random adjustment to the value passed from the check node back to the variable nodes.

By way of example, consider a simple iterative decoding algorithm that makes adjustments to LLR values in small increments of magnitude 3 toward a switch in polarity of the LLR value. To introduce randomness to the system, the simulated annealing process can provide a range of increments, for example –5 to +5. A value within the range can be randomly selected and the LLR value adjusted by the randomly chosen value rather than the established increment. In one embodiment, the process will choose the same value by which to adjust each LLR, while in other embodiments, the process can randomly choose individual adjustment values for each LLR. Additionally, the range of increments from which the random selection is made may be different for each LLR as well.

The temperature parameter T is also used to define the randomness introduced to the system as described above. For example, if the temperature parameter is set to 1, a relative low temperature, the system may establish a range of –0.5 to +0.5 from which to choose the adjustment to an LLR value. If the temperature is set to the higher temperature 2, the system may establish a larger range of –1.0 to +1.0 from which to choose the adjustment value.

Figure 15:
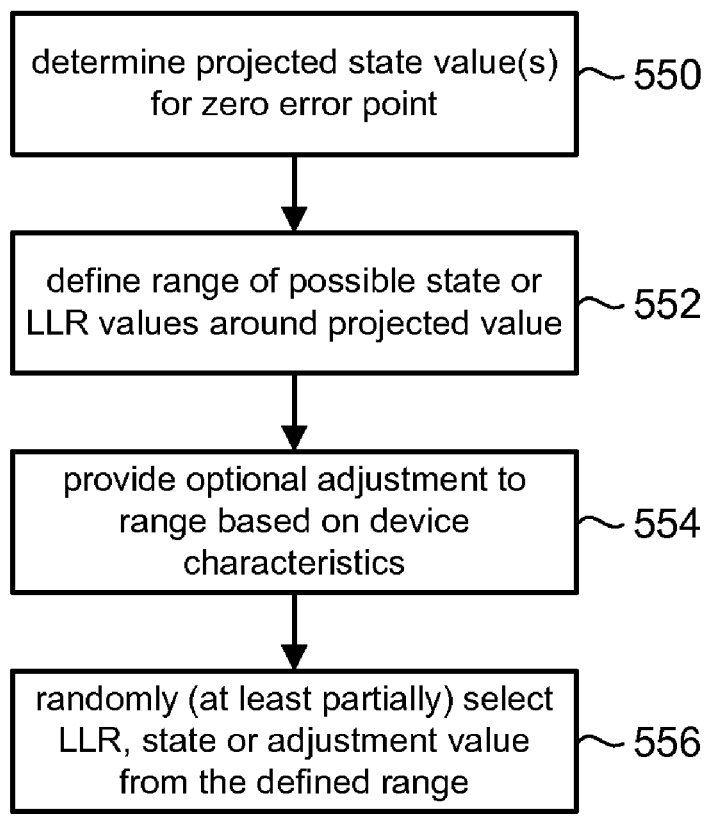
FIG. 15 is a flowchart describing a process of simulated annealing in accordance with one embodiment.

FIG. 15 is a flowchart describing one embodiment of simulated annealing that can be performed at step 522. At step 550, the direction of decreased error is selected to define a projected value of the trial states that represents the best determination by the system of where the point of zero error is located. At step 552, a range of possible values of Y, the trial states, is defined. The range may be provided as a range of LLR values around the LLR values corresponding to the projected value, as a range of the actual values of Y that may be selected, or as a range of adjustments to the existing LLR values that can be made. In one embodiment, the range is established based on the temperature parameter set at step 516, which itself is a representation of the amount of current error. At step 554, the range is optionally adjusted based on any a priori knowledge of the memory cells' characteristics. For a particular state for example, it may be known that the cell tends to experience a decrease in $V_{TH}$ over time. The range may thus be skewed to the lower side of the projected value since it is likely to be the more accurate direction. At step 556, a random LLR value from within the defined range or a random state value is selected from the defined range of states. In one embodiment, step 556 is not an absolute random selection, but rather, a guided selection that again, can be based on device characterization. For example, the selection may be skewed to select more values around a particular point within the range or it can be skewed to give greater probability to states being selected based on data retention issues. After making the selection(s) at step 556, the new LLR values will be applied during the next decoding iteration at step 512.

As earlier described the simulated annealing at step 518 need not be the same for every LLR value under consideration. Different adjustments to the LLR values, including defining different ranges, etc. can be used for different LLR values or bit locations. As such, the method of FIG. 15 may be repeated multiple times for different LLR values.

It is noted that the temperature parameter is set during each iteration of the decoding process. This facilitates adaptive and continuous adjustments to the amount of introduced randomness based on improvements in the level of errors achieved. For instance, as the process reaches the zero error level, evidenced by fewer error bits, the temperature parameter can be decreased or "cooled" to reduce the randomness introduced during each iteration. In this matter, the process becomes more precise as it approaches the desired endpoint with no errors. In another embodiment, the temperature parameter isn't performed after every iteration but after a certain number of iterations.

Figure 16:
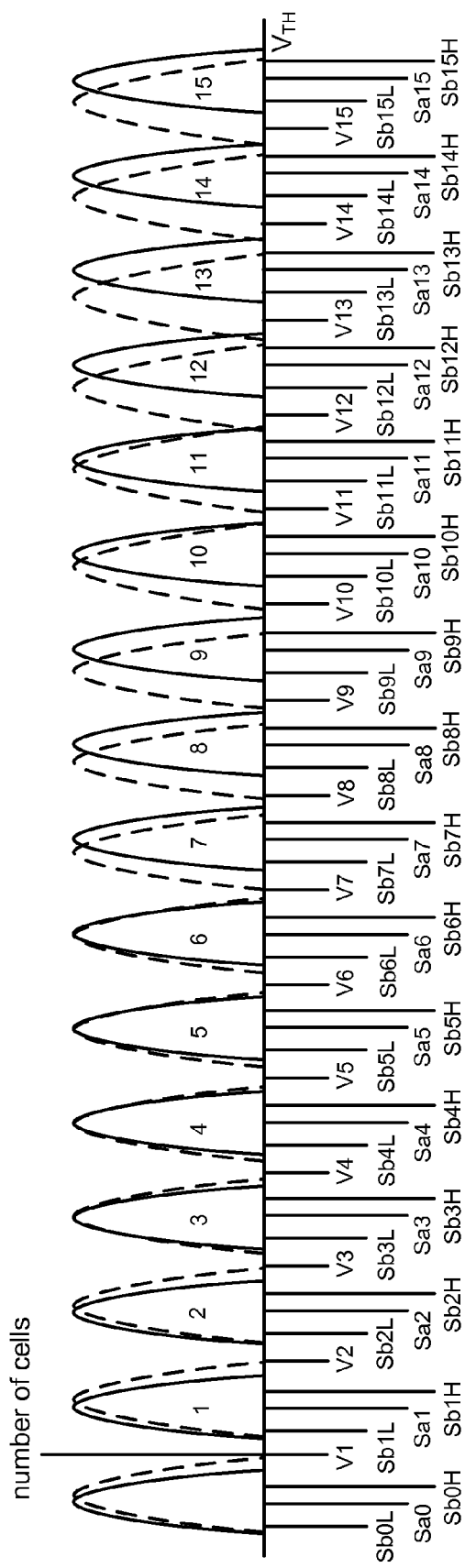
FIG. 16 is a graph of exemplary distributions of threshold voltages for a four-bit memory system, including a representation of the distributions after shifts in threshold voltage.

FIG. 16 illustrates an exemplary possible data retention scenario for a non-volatile memory system to describe the application of guided simulated annealing principles. FIG. 16 again depicts the threshold voltage distribution of a population of programmed memory cells that store four bits of data. In FIG. 16, the initial threshold distribution existing just after programming data to the memory cells is illustrated by the solid line. The dotted line illustrates the same population of memory cells after some time has elapsed. As is illustrated, the threshold voltage of some of the memory cells has shifted over time, causing the distributions of threshold voltages for each memory state to shift. This shift in threshold voltage can lead to read errors that necessitate the use of error correction controls as has been described. For example, it can be seen that a memory cell at the lower edge of the state 15 distribution (distribution after elapsed time period) has a threshold voltage below the state 15 hard read compare level V15. It can be seen that each state distribution widens as a result of shifts in threshold voltage over time. Looking closely at FIG. 16, it is further seen that states 0-4 each demonstrate a propensity on the part of the cells to have a positive shift in threshold voltage over time. States 7-15 on the other hand tend to exhibit a negative shift in threshold voltage over time.

This information, or more generally this type of information that may be gathered by characterizing individual or groups of devices can be used to guide the annealing process. Using this type of information to guide the annealing stands in contrast to some methods used in traditional communication ECC applications where it is desired to introduce completely random Gaussian white noise. Those states that tend to drift in the positive threshold voltage direction over time may be treated differently than those that tend to drift in the negative threshold voltage direction over time. Consider a cell that was read as being in state 15. It may be known, as in the example shown in FIG. 15, that cells programmed to states 15 and 16 tend to drift toward charge neutrality and a lower threshold voltage, which could result in a state 16 cell being misread as in state 15. The adjustment to the LLR values may take into account this information to skew the range of increments to the various LLR values so that any changes to trial bit values for this cell are more likely to result in the cell flipping to state 16 from state 15, than to state 14 from state 15.

To improve convergence times, higher order bit level information can be obtained from the memory cells during the error correction control process in one embodiment. The additional information may be referred to as "soft bits" and the corresponding operations referred to as soft bit read operations at soft bit compare points. "Soft bits" are collected by reading the memory cells at adjusted compare levels to provide more data that can be used by the correction engine to speed up or otherwise aid the convergence process. For example, each of the compare points used during the normal "hard" read operation can be incremented by 0.5V to provide soft bit compare levels in one embodiment. By reading at soft bit comparison levels, more data is made available to the error correction control process which can improve convergence performance. FIG. 16 depicts a set of read levels Sa1, Sa2, etc. for a first soft bit and a second set of read levels Sb1L, Sb1H, Sb2L, Sb2H, etc. for a second soft bit. More information regarding the use of soft bit data can be found in co-pending, commonly assigned, U.S. patent application Ser. No. 11/694,947. Techniques for performing multiple reads to obtain new or adjusted LLR values can also be incorporated with one or more embodiments. More information regarding the use of multiple reads can be found in co-pending, commonly assigned, U.S. patent application Ser. No. 11/693,649.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory system, comprising:
   a set of non-volatile storage elements;
   managing circuitry in communication with the set of non-volatile storage elements, the managing circuitry reads information from the set of storage elements by:
      reading a set of user data from the set of non-volatile storage elements;
      detecting one or more errors associated with the set of user data; and
      iteratively decoding the user data using reliability metrics for portions of the set of user data, the decoding includes simulating annealing for one or more portions of user data to cause a change in one or more of the corresponding reliability metrics;
      wherein simulating annealing includes guiding the simulated annealing based on a predetermined characterization of the set of non-volatile storage elements; and
      wherein the predetermined characterization of the set of non-volatile storage elements includes a predetermined characterization of shifts in threshold voltage of the set of non-volatile storage elements.

2. The non-volatile memory system of claim 1, wherein: simulating annealing includes introducing a random adjustment to one or more of the reliability metrics.

3. The non-volatile memory system of claim 1, wherein: simulating annealing includes setting a parameter to influence randomness inserted into the iterative decoding.

4. The non-volatile memory system of claim 3, wherein: setting the parameter includes setting the parameter based on the one or more errors associated with the set of user data.

5. The non-volatile memory system of claim 4, wherein: setting the parameter includes setting the parameter to increase the randomness for larger errors associated with the user data.

6. The non-volatile memory system of claim 3, wherein setting the parameter comprises setting the parameter to zero.

7. The non-volatile memory system of claim 1, wherein:
   iterative decoding includes, for at least one iteration, determining a predicted value for one or more of the portions of user data to use during a subsequent iteration; and
   simulating annealing includes, providing a range of adjustments to the one or more reliability metrics relative to the predicted value and selecting, at least partially at random, one of the adjustments from the range.

8. The non-volatile memory system of claim 7, wherein providing the range of adjustments includes centering the range with respect to the predicted value.

9. The non-volatile memory system of claim 8, wherein providing the range of adjustments includes offsetting the range with respect to the predicted value based on characterizing a data retention property of the set of non-volatile storage elements.

10. The non-volatile memory system of claim 1, wherein:
    the iterative decoding is iterative probabilistic decoding;
    the reliability metrics are logarithmic likelihood ratios.

11. The non-volatile memory system of claim 10, wherein:
    the simulated annealing includes randomly adjusting one or more of the logarithmic likelihood ratios after one or more iterations.

12. The non-volatile memory system of claim 1, wherein: the set of non-volatile storage elements is a set of NAND flash memory cells.

13. The non-volatile memory system of claim 1, wherein: the set of non-volatile storage elements is a set of multi-state flash storage elements.

14. The non-volatile memory system of claim 1, wherein: iteratively decoding the user data includes performing one or more parity checks.

15. The non-volatile memory system of claim 1, wherein: reading includes at least one of voltage sensing and current sensing.

16. The non-volatile memory system of claim 1, wherein: the managing circuitry includes at least one of a controller and a state machine.

17. The non-volatile memory system of claim 1, wherein: the user data includes one or more parity bits.

18. A non-volatile memory system, comprising:
    a set of non-volatile storage elements; and
    managing circuitry in communication with the set of storage elements, the managing circuitry reads the set of storage elements by:
       detecting state information for the set of non-volatile storage elements;
       providing one or more code words based on the state information;
       detecting one or more errors associated with the one or more code words;
       performing a number of iterations of decoding for the one or more code words, wherein decoding includes assigning reliability metrics to bits of the one or more code words and adjusting the reliability metrics for subsequent decoding iterations in an attempt to decrease the one or more errors; and after the number of iterations, simulating annealing for the one or more code words, wherein simulating annealing includes providing at least a pseudo-random adjustment to one or more of the reliability metrics, the pseudo-random adjustment being based on the one or more errors associated with the one or more code words and a predetermined characterization of shifts in threshold voltage of the set of non-volatile storage elements.

19. A non-volatile memory system, comprising:
a set of non-volatile storage elements;
managing circuitry in communication with the set of non-volatile storage elements, the managing circuitry performs one or more read operations that include:
detecting state information for the set of non-volatile storage elements;
providing one or more code words based on the state information;
detecting one or more errors associated with the one or more code words; and
performing a number of iterations of decoding for the one or more code words, wherein decoding includes assigning reliability metrics to bits of the one or more code words and adjusting the reliability metrics for subsequent decoding iterations in an attempt to decrease the one or more errors,
wherein at least one of the iterations includes guiding an adjustment to at least one reliability metric based on a predetermined characterization of the set of non-volatile storage elements; and
wherein the predetermined characterization of the set of non-volatile storage elements includes a predetermined characterization of shifts in threshold voltage of the set of non-volatile storage elements.

\* \* \* \* \*